United States Patent [19]

Leussler

[11] Patent Number: 5,500,594
[45] Date of Patent: Mar. 19, 1996

[54] RF QUADRATURE COIL SYSTEM

[75] Inventor: Christoph G. Leussler, Hamburg, Germany

[73] Assignee: U.S. Philips Corporation, New York, N.Y.

[21] Appl. No.: 954,948

[22] Filed: Sep. 30, 1992

Related U.S. Application Data

[63] Continuation of Ser. No. 533,561, Jun. 5, 1990, abandoned.

[30] Foreign Application Priority Data

Jun. 8, 1989 [DE] Germany .................. 39 18 743.8

[51] Int. Cl.⁶ .................................................. G01R 33/28
[52] U.S. Cl. .................................... 324/318; 324/322
[58] Field of Search ............................ 324/318, 322, 324/314, 300; 128/653.5

[56] References Cited

U.S. PATENT DOCUMENTS

| | | | |
|---|---|---|---|
| 2,509,750 | 5/1950 | Vaudoux et al. ........................ | 336/188 |
| 4,467,282 | 8/1984 | Siebold ................................... | 324/309 |
| 4,528,509 | 7/1985 | Radda et al. ............................ | 324/309 |
| 4,590,427 | 5/1986 | Fukushima et al. .................... | 324/318 |
| 4,712,069 | 12/1987 | Kemner et al. ......................... | 324/318 |
| 4,739,271 | 4/1988 | Haase ...................................... | 324/318 |
| 4,766,383 | 8/1988 | Fox et al. ................................ | 324/322 |
| 4,816,766 | 3/1989 | Zabel et al. ............................. | 324/318 |
| 4,878,023 | 10/1989 | Overweg et al. ....................... | 324/322 |
| 4,882,540 | 11/1989 | Domenick et al. ..................... | 324/318 |
| 4,987,370 | 1/1991 | Leussler ................................. | 324/318 |
| 4,998,066 | 3/1991 | Wichern et al. ........................ | 324/322 |
| 5,003,265 | 3/1991 | Leussler ................................. | 324/318 |
| 5,144,241 | 9/1992 | Oppelt et al. .......................... | 324/318 |
| 5,185,577 | 2/1993 | Minemura .............................. | 324/318 |

OTHER PUBLICATIONS

L. Li & R. A. Kruger, "A Highly Efficient Double-Tuned Resonator for Phosphorous-31 Imaging in Ex-Vivo Bone", Works in Progress, Society of Magnetic Resonance in Medicine, Seventh Annual Meeting & Exhibition, Aug. 20-26, 1988, p. 111.

*Primary Examiner*—Sandra L. O'Shea
*Assistant Examiner*—Raymond Y. Mah
*Attorney, Agent, or Firm*—Edward Blocker; Bernard Franzblau

[57] ABSTRACT

As rf quadrature coil system for a magnetic resonance examination apparatus, comprises two similar rf coils connected to an rf receiver and/or an rf transmitter and arranged so as to be offset 90° with respect to one another. Each rf coil comprises several turns which are situated in mutually parallel planes. The planes of the turns of one rf coil extend perpendicular to the planes of the turns of the other rf coil. The quadrature coil system can be used in magnetic resonance examination apparatus in which the uniform, steady magnetic field required for the examination extends perpendicular to the longitudinal axis of the patient to be examined.

9 Claims, 2 Drawing Sheets

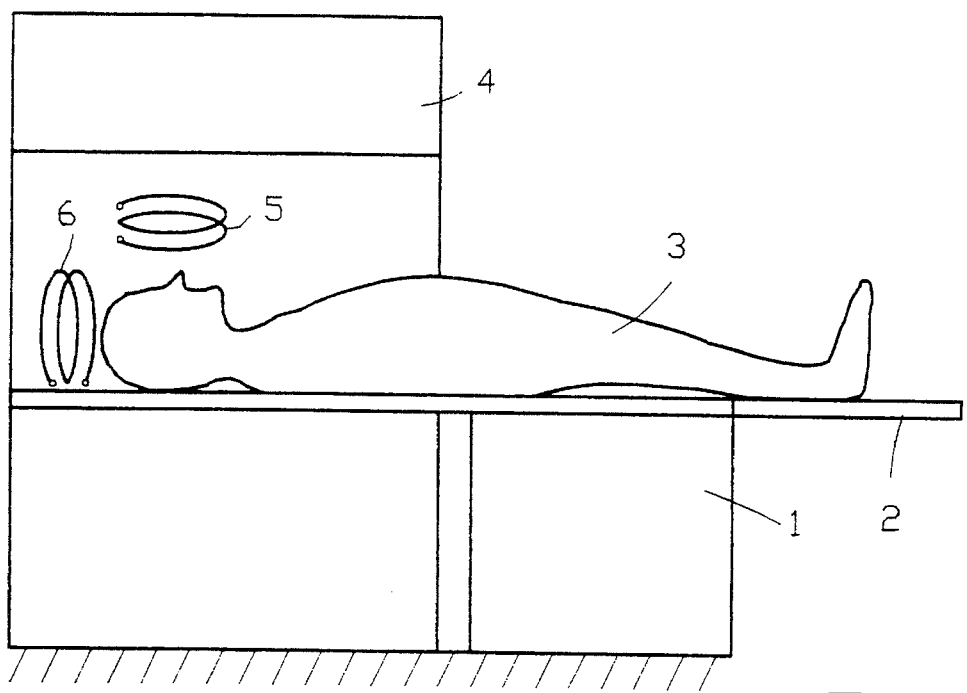
Fig.1
Fig.2
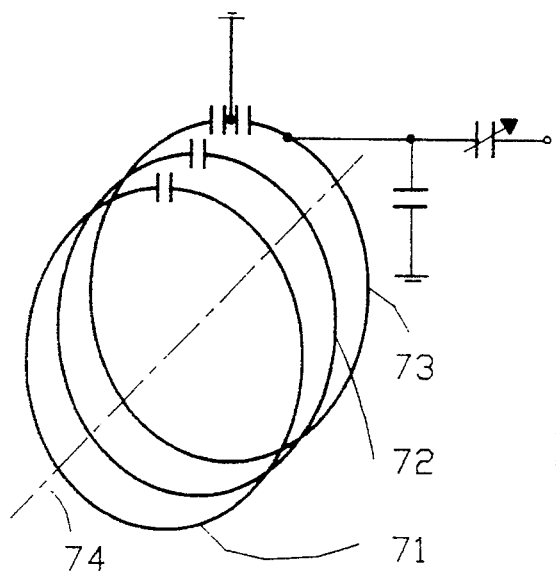
Fig.3
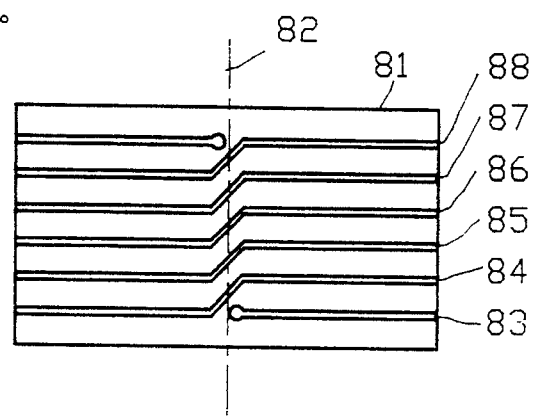

RF QUADRATURE COIL SYSTEM

This is a continuation of application Ser. No. 07/533,561, filed Jun. 5, 1990, now abandoned.

FIELD OF THE INVENTION

This invention relates to an rf quadrature coil system for a magnetic resonance examination apparatus, comprising two similar rf coils which can be connected to an rf receiver and/or an rf transmitter and which are arranged so as to be offset 90° with respect to one another.

BACKGROUND OF THE INVENTION

A system of this kind is known from EP-B 71896 corresponding to U.S. Pat. No. 4,467,282. It can be used for receiving magnetic resonance signals and/or for generating rf magnetic fields. In the case of reception, the signal to noise ratio can be improved by as much as 3 dB in comparison with reception by one of these coils. When these coils are used in the transmission mode, circularly polarized magnetic rf fields can be generated thereby when rf currents which have been phase shifted 90° with respect to one another are applied to the two rf coils, so that the required transmission power is halved. The rf fields should then extend not only perpendicularly to one another, but also perpendicular to the steady, uniform magnetic field which is indispensable for examinations based on magnetic resonance.

The rf coils of the known system are formed by saddle coils. These saddle coils are arranged on the surface of a cylindrical supporting means and generate magnetic fields which extend perpendicular to the axis of the supporting means. Taking into account that the longitudinal axis of a patient being examined should coincide with the axis of the supporting means it will be evident that such quadrature coils are only suitable for magnetic resonance examination apparatus in which the uniform, steady magnetic field generated by the magnetic resonance examination apparatus extends in the direction of the axis of the supporting means, i.e. in the longitudinal direction of the patient.

SUMMARY OF THE INVENTION

It is the object of a present invention to provide a quadrature coil system which is suitable for magnetic resonance examination apparatus whose steady, uniform magnetic field extends perpendicular to the longitudinal axis of a patient being examined therein.

This object is achieved in accordance with the invention in that each rf coil comprises several turns which are situated in mutually parallel planes, the planes of the turns of one rf coil extending perpendicular to the planes of the turns of the other rf coil.

Thus, in accordance with the invention each rf coil comprises several turns which are situated in mutually parallel planes. The rf magnetic field generated by such an rf coil extends perpendicular to the planes of the turns. These turns enclose, for example the body of the patient or his skull; the rf magnetic fields inside a magnetic resonance examination apparatus then extend perpendicular to the steady, uniform magnetic field when the latter extends parallel to the planes of the turns of the two coils and hence perpendicular to the longitudinal axis of the patient.

In a further embodiment in accordance with the invention, the respective turns of each of the two rf coils are electrically connected in series. This embodiment is suitable for magnetic resonance examinations at a comparatively low Larmor frequency or for magnetic resonance examination apparatus whose uniform, steady magnetic field has only a low magnetic flux density.

In contrast therewith, in a further embodiment the turns are formed as resonators due to capacitive coupling of their ends, all resonators being tuned to the same frequency, the resonators of each rf coil being only inductively coupled to one another. This embodiment is more suitable for higher Larmor frequencies or higher magnetic flux densities.

The individual turns of an rf coil usually do not have the necessary mechanical stability. Therefore, the turns must be supported.

To this end, in a first further embodiment the two rf coils comprise a common cylindrical supporting means, the planes of the turns of two coils intersecting the axis of the supporting means at an angle other than 90° and extending perpendicular to one another.

In a second further embodiment, however, each of the two coils is arranged on a respective cylindrical supporting means so that the axes of the means extend perpendicular to the planes of the turns, the supporting means being arranged so that their axes intersect at an angle of 90°, the two supporting means enclosing a part of the respective other supporting means. This embodiment is suitable for the examination of the skull or the extremities of a patient, but not for whole-body examinations.

BRIEF DESCRIPTION OF THE DRAWING

The invention will be described in detail hereinafter with reference to the drawing. Therein:

FIG. 1 diagrammatically shows a magnetic resonance examination apparatus comprising an rf quadrature coil system.

FIG. 2 shows a first embodiment of an rf coil.

FIG. 3 shows a second embodiment of an rf coil.

DESCRIPTION OF THE PREFERRED EMBODIMENT

Figure 4:
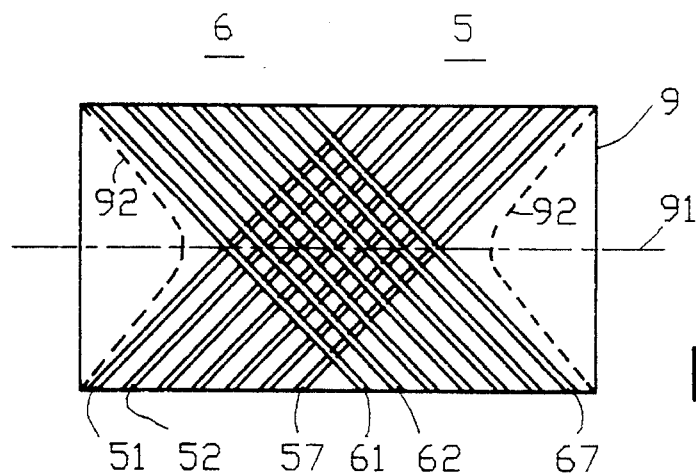
FIG. 4 shows an embodiment in which the two rf coils are arranged on a common supporting means.

The magnetic resonance examination apparatus shown in FIG. 1 comprises, inter alia, a patient table 1 on the top 2 of which a patient 3 is arranged in the horizontal position. The magnetic resonance examination apparatus also comprises a unit 4 which at least partly encloses the body of the patient. This unit comprises, inter alia, a magnet for generating a uniform, steady magnetic field in an examination zone covering the patient. This magnetic field extends perpendicular to the longitudinal direction of the patient 3. FIG. 1 also shows, be it only diagrammatically, two similar rf coils 5 and 6 which together constitute a quadrature coil system. These rf coils can be used for generating rf magnetic fields and/or for receiving magnetic resonance signals from the examination zone. The coils 5 and 6 must be oriented so that the magnetic fields to be generated thereby extend perpendicular to the magnetic field of the respective other coil and perpendicular to the uniform, steady magnetic field. The coils must be tuned to the so-called Larmor frequency f which is calculated from the magnetic flux density B of the uniform, steady magnetic field in accordance with the relation:

$$f = cB,$$

where c is the gyromagnetic ratio which amounts to, for example, 42.5 MHz/T for protons. In the transmission mode, the coils 5 and 6 receive rf currents of Larmor frequency whose phase has been shifted 90° with respect to one another.

FIGS. 2 and 3 show two different feasible constructions of the coils which can form a quadrature coil system in conjunction with a similar coil of the same type which has been offset 90° in space.

FIG. 2 shows a single rf coil which consists of several resonators. Each resonator comprises a circular conductor loop 71, 72, 73, which loops are arranged in parallel planes so as to be concentric with a common axis 74. These conductor loops are each time tuned to the same resonance frequency by means of at least one capacitor. An rf coil of this kind is known from German Patent Application P 38 16 831.6 which corresponds to U.S. Pat. No. 5,003,265.

A coil of this kind has as many oscillation modes as there are resonators. In one oscillation mode the currents in all resonators flow in the same direction. This oscillation mode is used for the magnetic resonance examinations and is combined with the lowest resonance frequency which is below the frequency to which the individual resonators are tuned. The individual resonators are then only inductively coupled to one another. This inductive coupling enables the connection of only one turn (the turn 73 in FIG. 2) of an rf transmitter or an rf receiver in order to generate magnetic rf fields. The magnetic coupling between the turns ensures that, in the transmission mode, an rf field is generated also in the plane of the non-connected resonator 71, and that magnetic resonance signals generated in this plane can be received even though the rf magnetic field in this plane is somewhat weaker than that in the plane of the resonator 72 or the sensitivity of the plane of the resonator 71 is lower than that for signals from the plane of the resonator 73. Which of the resonators is actually connected in a specific case depends on the examination situation. However, it is alternatively possible to connect several or all resonators to the transmitter or the receiver in parallel.

For given geometrical dimensions of a conductor loop 71 . . . 73, the value of the capacitance to be connected to its ends depends only on the operating frequency. Therefore, the capacitance must be higher as the operating frequency is lower. Capacitors of high capacitance, however, have a quality factor which is lower than that of capacitors having a low capacitance, so that the quality factor of the resonator formed by the conductor loop and at least one capacitor also decreases as the frequency decreases.

For reasons of mechanical stability, the turns 71 . . . 73 should be arranged on the surface of a hollow cylindrical supporting means in practice. This supporting means is not shown in FIG. 2.

FIG. 3 shows another type of coil which can form a quadrature coil in conjunction with a further coil of the same type. It concerns a so-called solenoid coil which comprises a single winding consisting of several turns. Such a coil could in principle be formed by a conductor helically wound onto a supporting means with a uniform pitch.

In the present embodiment, however, several turns 83 . . . 88 are wound on the supporting means 81, with the symmetry axis 82, in mutually parallel planes. All turns are interrupted over a small part of the circumference of the supporting means. Of the free ends thus formed, the left hand end of each turn is connected to the right-hand end of the oppositely situated turn. Thus, only the right-hand end of the turn 83 and the left-hand end of the turn 84 remain free, which ends thus constitute the connections of the solenoid coil; a capacitor is connected therebetween for tuning. Such a coil has a high quality factor for as long as the overall length of the (conductively series connected) turns is less than one quarter of the wavelength of the relevant operating frequency. Thus, the quality factor of this type of coil decreases as the frequency increases.

Therefore, there exists a limit frequency for which the quality factors of the coils shown in the FIGS. 2 and 3 are the same. Below this frequency the coil shown in FIG. 3 has a higher quality factor, whereas above this frequency the quality factor of the coil shown in FIG. 2 is higher. The frequency depends on the diameter of the turns and the number of turns. For a head coil having a turn diameter of 30 cm and a total number of 11 turns, this frequency amounts to approximately 2.5 MHz. This is the Larmor frequency arising in a magnetic resonance examination apparatus with a magnetic flux density of approximately 0.06 Tesla.

The hollow-cylindrical supporting means supporting the coils shown in FIG. 2 or FIG. 3 may have a circular or an elliptical cross-section. Its cross-section, however, may also be rectangular or polygonal. The dimensions and geometries of the cross-section should be adapted to the anatomy of a typical patient, so that the turns are situated as near as possible to a patient. In the receiving mode a high sensitivity is then achieved whereas in the transmission mode only a low transmission power is required.

FIG. 4 shows a first embodiment of a quadrature coil in accordance with the invention. The quadrature coil comprises a hollow-cylindrical supporting means 9 having a cylinder axis 91. In this supporting means, customarily consisting of an electrically insulating, magnetically neutral material, the body of the patient or his skull is introduced during an examination. The longitudinal axis of the patient then extends parallel to the cylinder axis 91. The two rf coils 5 and 6 which together constitute the quadrature coil are arranged on the supporting means 9. The turns 51 . . . 57 of the rf coil 5 are situated in parallel planes which intersect the cylinder axis 91 at an angle of 45°. The planes in which the turns 61 . . . 67 of the rf coil 6 are situated also extend parallel to one another and also intersect the axis 91 at an angle of 45°, but these planes extend perpendicular to those of the turns 51 . . . 57. The turns 51 . . . 57 on the one side and the turns 61 . . . 67 on the other side thus intersect.

In order to prevent the turns of one coil from making conductive contact with the turns of the other coil, an insulating foil may be provided at the area of intersection. The conductors constituting the individual turns may have a flat (band-like) cross-section or a tubular cross-section. In the case of a tubular cross-section, these conductors may be compressed at the areas where they intersect the conductors of the other rf coil; at these areas insulating discs can be arranged between the intersecting conductors. It can thus be achieved that even at the area of intersection of the turns the outer circumference hardly increases.

The magnetic rf field generated by the coil 5 extends perpendicular to the planes of the turns of this coil and parallel to the planes of the turns of the coil 6. Similarly, the rf field generated by the coil 6 extends perpendicular to the planes of the turns of this coil and parallel to the planes of the turns of the coil 5. When this coil is used in an apparatus as shown in FIG. 1, the uniform, steady magnetic field should extend parallel to the planes of the turns of the two coils, i.e. perpendicular to the plane of drawing in FIG. 4 or FIG. 1.

The quadrature coil shown in FIG. 4 can be used for whole-body examinations when the inner diameter of the supporting means 9 is sufficiently large to accommodate the body of the patient 3 (FIG. 1). When the uniform, steady magnetic field generated by the unit 4 (FIG. 1) does not extend perpendicular but vertically with respect to the plane of drawing of FIG. 1, this quadrature coil can also be used for examination of the body if it is rotated through 90° about the axis 91 with respect to the position shown in FIG. 4.

The quadrature coil shown in FIG. 4 can also be used for cranial examinations, in which case its inner diameter may be smaller than required for whole-body examinations. To this end, as denoted by the broken lines 92, the opening of the supporting means 9 can be widened at the area in which no turns are present. In this area of the opening the shoulders of the patient are accommodated in the case of a cranial examination. The head then projects into the zone on both sides of which the turns of the coil intersect. It is only in this zone and its immediate vicinity that a circularly polarized rf field occurs in the transmission mode or that a higher sensitivity occurs in the receiving mode.

Assuming that the shoulders of the patient 3 should rest on the table top 2 during a cranial examination, the quadrature coil must be arranged in a magnetic resonance examination apparatus in the manner shown in FIG. 4 and the uniform steady magnetic field generated therein must extend horizontally and perpendicular with respect to the planes of drawing of the FIGS. 1 and 4. However, should the uniform, steady magnetic field extend vertically instead, it is not possible to rotate the coil 9 through 90° (about the axis 91), because it is then impossible to introduce the skull of the patient far enough into the supporting means 91.

Figure 5:
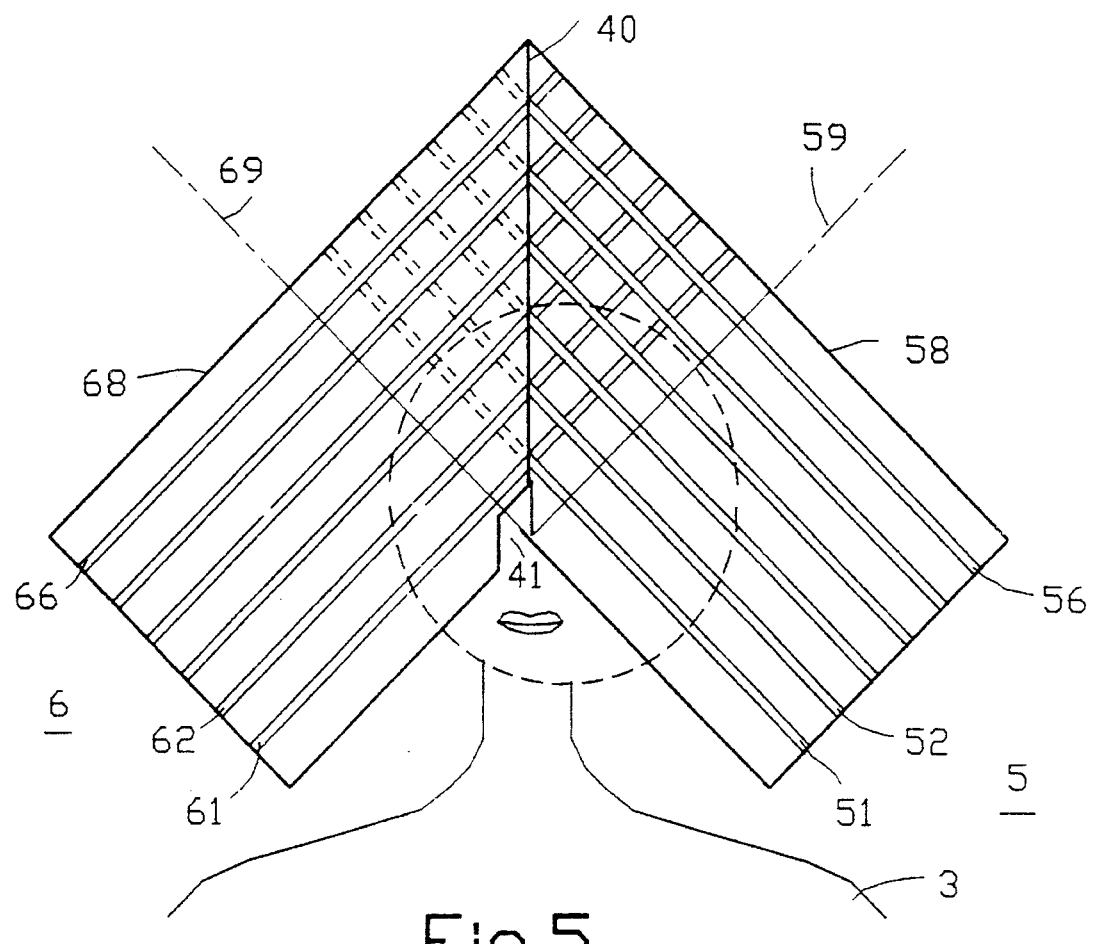
FIG. 5 shows an embodiment in which a separate supporting means is provided for each rf coil.

A quadrature coil system which is suitable for such a case is shown in FIG. 5. Each of the two coils 5 and 6 comprises a respective hollow-cylindrical supporting means 58 and 68, respectively, having an annular cross-section. The cylinder axes 59 and 69 of these means intersect at right angles. In order to achieve an as large as possible area for introducing the skull of the patient, it would be desirable to arrange the coils 5 and 6 so that the facing edges of the supporting means 58, 68 always contact one another. Because the space of such a coil which is filled by the magnetic field is essentially limited to the interior of each supporting means and its direct vicinity, only a very small zone would then be obtained in which the fields are superposed and in which the desired properties of a quadrature coil occur. However, should these coils be combined instead so that the axis 59 or 69 of one coil was coincident with the central plane of the respective other coil, a large volume with a circularly polarized magnetic field or with attractive receiving properties would be obtained, but the openings of such a construction would not be large enough for the skull of a patient. Therefore, the arrangement shown in FIG. 5 represents a compromise between the contradictory requirements.

In FIG. 5 the two supporting means 58 and 68 are arranged so that the respective cylinder axis 59, 69, thereof is situated coextensive with the end face of the respective other supporting means. For the same diameter of the supporting means it is then unavoidable that the envelope of these means penetrate one into the other. In the case of real means this implies that one of the two means must be interrupted in the area of straight line 40 in FIG. 5. In the present embodiment this is the supporting means 58. Of course line 40 is planar in plan view of the curved interface of the two means. The turns 61, ... 66 of the coil 6 are arranged on the other supporting means 68 without interruption in the area of penetration 40. This supporting means has an opening 41 for the supporting means 58 in the two oppositely situated positions in which the facing end faces of the supporting means 58 intersect the supporting means 68. However, in the remaining area of penetration the supporting means 58 is interrupted and hence also the turns 51 ... 56 of the coil 5 provided thereon. In order to establish electrical contact between these turns before (non interrupted lines) and after the interruption (broken lines), contacting must take place through the supporting means 68 at the area of the interruption.

FIG. 5 shows the position of the quadrature coil 5, 6 in respect of the skull of the patient 3. The rf fields generated by this coil thus each act on the patient at an angle of 45° with respect to the longitudinal axis of the patient parallel to the line 40. For magnetic resonance examinations, the uniform, steady magnetic field must extend parallel to the planes of the turns of the coils 5 and 6, i.e. perpendicular to the plane of drawing in FIG. 5 and vertically in FIG. 1. For an inner diameter of the supporting means 58, 68 amounting to 30 cm, a free opening having a width of approximately 22 cm and a height of 30 cm remains for introducing the skull of the patient.

In the quadrature coils shown in the FIGS. 4 and 5 the coils 5 and 6 may either have the construction shown in FIG. 2 or that shown in FIG. 3. When the coils are used for high frequencies, the system shown in FIG. 2 is to be preferred, whereas that shown in FIG. 3 is to be preferred for lower frequencies.

A quadrature coil exhibits the desired behavior only when the two rf coils constituting the quadrature coil are fully decoupled from one another. This means that the rf field generated by one coil may not induce any voltage whatsoever in the other coil. Small symmetry errors which could lead to such coupling, however, cannot be fully precluded in practice. In order to ensure the necessary uncoupling in such a case, the coils 5 and 6 can be interconnected by way of a suitable decoupling circuit not shown which produces, in the respective other coil, a current which exactly compensates for the current caused by the magnetic coupling between the two coils. In the simplest case for this purpose use can be made of a capacitor, as described in detail in German Patent Application P 38 20 168.2 which corresponds to U.S. Pat. No. 4,998,066.

What is claimed is:

1. An rf quadrature coil system for a magnetic resonance examination apparatus, comprising:

two like rf coils adapted to be connected to a selected one of an rf receiver and rf transmitter and which coils are offset 90° with respect to one another, the two rf coils each comprise a plurality of turns lying only in mutually parallel planes, the planes of the turns of one rf coil extending perpendicular to the planes of the turns of the other rf coil, wherein the turns each comprise annular portions, each turn being formed as a resonator including a capacitive coupling at its ends, all resonators being tuned to the same frequency, the resonators of each rf coil being only inductively coupled to one another.

2. An rf quadrature coil system as claimed in claim 1, wherein the system comprises means for selectively connecting one of the resonators of the two rf coils to an rf transmitter or an rf receiver.

3. An rf quadrature coil system for a magnetic resonance examination apparatus, comprising:

two like rf coils adapted to be connected to a selected one of an rf receiver and rf transmitter and which coils are offset 90° with respect to one another, the two rf coils each comprise a plurality of turns lying in mutually parallel planes, the planes of the turns of one rf coil extending perpendicular to the planes of the turns of the other rf coil, wherein each of the two coils is arranged on a respective cylindrical supporting means so that the axes of the supporting means extend perpendicular to the planes of the turns, the supporting means being arranged so that their axes intersect at an angle of 90°, one of the supporting means enclosing a part of the respective other supporting means.

4. An rf coil system as claimed in claim 1 wherein the two rf coils comprise a common cylindrical supporting means, the planes of the turns of the two coils intersecting the axis of the supporting means at an angle other than 90° and extending perpendicular to one another.

5. An rf coil system as claimed in claim 2 wherein the two rf coils comprise a common cylindrical supporting means, the planes of the turns of the two coils intersecting the axis of the supporting means at an angle other than 90° and extending perpendicular to one another.

6. An rf quadrature coil system for a magnetic resonance examination apparatus, comprising:

two like rf coils adapted to be connected to a selected one of an rf receiver and rf transmitter and which coils are offset 90° with respect to one another, the two rf coils each comprise a plurality of turns lying in mutually parallel planes, the planes of the turns of one rf coil extending perpendicular to the planes of the turns of the other rf coil, wherein the respective turns of each of the two rf coils are electrically connected in series and each of the two coils is arranged on a respective cylindrical supporting means so that the axes of the supporting means extend perpendicular to the planes of the turns, the supporting means being arranged so that their axes intersect at an angle of 90°, one of the supporting means enclosing a part of the respective other supporting means.

7. An rf coil system as claimed in claim 1 wherein each of the two coils is arranged on a respective cylindrical supporting means so that the axes of the supporting means extend perpendicular to the planes of the turns, the supporting means being arranged so that their axes intersect at an angle of 90°, one of the supporting means enclosing a part of the respective other supporting means.

8. An rf coil system as claimed in claim 2 wherein each of the two coils is arranged on a respective cylindrical supporting means so that the axes of the supporting means extend perpendicular to the planes of the turns, the supporting means being arranged so that their axes intersect at an angle of 90°, one of the supporting means enclosing a part of the respective other supporting means.

9. An rf quadrature coil system for a magnetic resonance examination apparatus comprising only two like rf coils adapted to be connected to a selected one of an rf receiver and rf transmitter and which coils are offset 90° with respect to one another, wherein a first of the two rf coils includes a plurality of turns lying in mutually parallel planes to form a first channel of the rf quadrature coil system, and a second of the two rf coils includes a plurality of turns lying in mutually parallel planes to form a second channel of the rf quadrature coil system, and wherein the planes of the turns of the first rf coil extend perpendicular to the planes of the turns of the second rf coil, wherein the turns each comprise annular portions, each turn being formed as a resonator including a capacitive coupling at its ends, all resonators being tuned to the same frequency, the resonators of each rf coil being only inductively coupled to one another.

* * * * *